United States Patent [19]

Fitzpatrick

[11] Patent Number: 4,603,929
[45] Date of Patent: Aug. 5, 1986

[54] CONNECTOR SHROUD

[75] Inventor: Michael H. Fitzpatrick, Sunnyvale, Calif.

[73] Assignee: Northern Telecom Limited, Montreal, Canada

[21] Appl. No.: 701,286

[22] Filed: Feb. 13, 1985

[51] Int. Cl.[4] .............................................. H05K 1/00
[52] U.S. Cl. .............................. 339/17 C; 339/186 M
[58] Field of Search .......... 339/186 R, 186 M, 184 R, 339/184 M, 185, 17 C, 17 LC, 17 M, 91 R, 75 R, 75 MP, 220 R, 220 M, 221 R, 221 M

[56] References Cited

U.S. PATENT DOCUMENTS

| | | | |
|---|---|---|---|
| 3,500,288 | 3/1970 | Startin et al. | 339/184 M |
| 3,753,212 | 8/1973 | Yamada et al. | 339/91 R |
| 3,848,951 | 11/1974 | Michaels et al. | 339/91 R |
| 3,897,131 | 7/1975 | Stauffer | 339/220 R |
| 3,963,301 | 6/1976 | Stark | 339/186 M |
| 4,350,409 | 9/1982 | Kato et al. | 339/186 M |
| 4,376,565 | 3/1983 | Bird et al. | 339/186 M |
| 4,426,123 | 1/1984 | Ritchie et al. | 339/75 MP |
| 4,448,471 | 5/1984 | Berry et al. | 339/186 M |

Primary Examiner—Gil Weidenfeld
Assistant Examiner—David L. Pirlot
Attorney, Agent, or Firm—Schwartz, Jeffery, Schwaab, Mack, Blumenthal & Evans

[57] ABSTRACT

A back plane for a shelf of electronic circuit modules includes back plane connectors for providing signal and power connections with circuit module connectors near a front face of the back plane and for providing connection with bus or cable connectors near a back face of the back plane. A connector shroud includes a body or base portion and side walls extending from the base portion for guiding the bus or cable connector in alignment with pins of the back plane connector. The base portion includes apertures for accepting the pins which protrude therethrough. Most of the apertures are of sufficient size to freely accept the pins and the remainder of the apertures are of a size to provide an interference fit with corresponding ones of the pins. A key member extends normal to the base portion in a direction opposite of the side walls. In assembly with the back plane, the key member extends through part of an elongated opening in the back plane adjacent the back plane connector. The key member is positioned to cooperate with a complementary structure in an electronic circuit module of a type acceptable for connection to the back plane connector. A keyway defined in one of the side walls of the shroud is of a predetermined position in relation to a particular position of the key member and defines which of the bus and/or cable connectors are connectable with the back plane connector. The key member also includes a releasable latch for retaining the connector shroud in assembly with the back plane.

13 Claims, 19 Drawing Figures

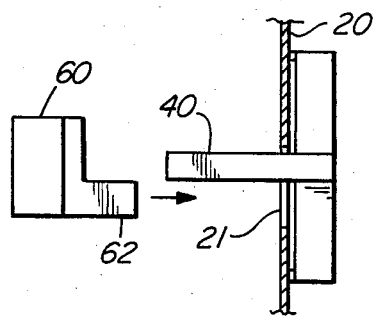
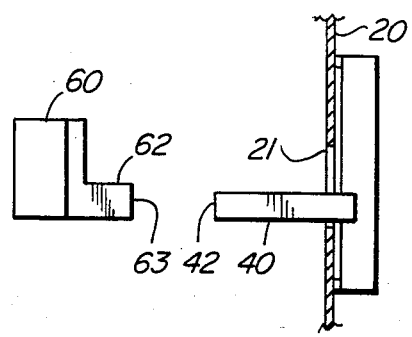
FIG. 13  FIG. 14
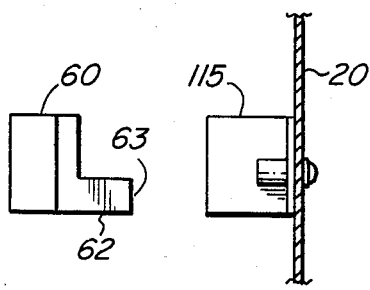
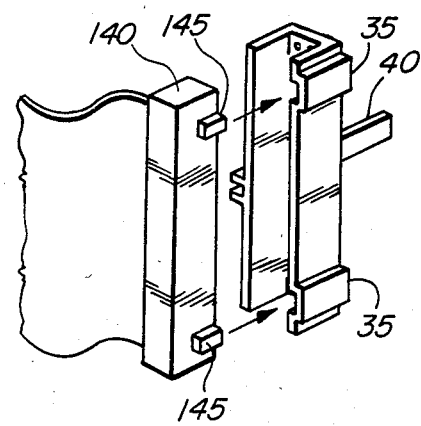
FIG. 15  FIG. 16
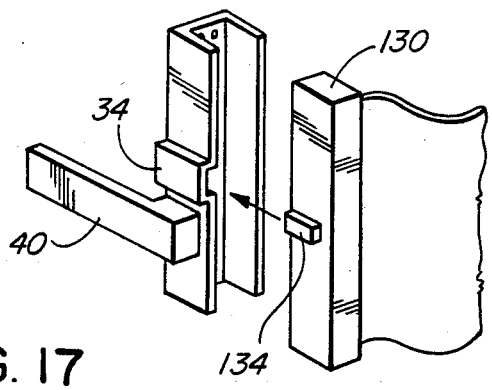
FIG. 17

CONNECTOR SHROUD

FIELD OF THE INVENTION

The invention is concerned with interconnection of shelf-retained electronic circuit modules and more particularly the invention is in the field of connector shrouds for defining permissible back plane interconnect configurations in an electronic apparatus.

BACKGROUND OF THE INVENTION

In the design of electronic systems which include frame mounted modules often consisting of printed circuit boards and the like it has become customary, practical, and preferable to concentrate the hardware for providing various major system functions in separate ones of the printed circuit boards. By this means simplified modular maintenance and overall improved system operation are economically achieved. Therefore in new systems there is a trend toward lesser duplication of individual modules, or stated differently there is a greater proliferation of module types.

For example electronic telecommunication switching systems typically require circuit modules for functions of line interface, trunk interface, network switching, signalling, call control and power supply. More recently newer functions of digital line interface, voice messaging, text messaging, data practical conversion, data language translation and mass storage have been suggested as being value added services which are particularly desirable in systems of the electronic private branch exchange (EPBX) type. The various circuit modules have quite different connection requirement, however as such systems vary widely in function and size it has been found convenient to provide at least two physical circuit locations which will accept modules of one general type or another such that the EPBX is economically tailorable to a customer's requirements. Hence it is typical practice to segregate those modules concerned with line and trunk interface functions to a shelf with network and line and trunk interconnect facilities and to segregate the remaining modules with network and controller interface requirements into another shelf in the EPBX.

Very recently it has become practical to achieve massive reductions in module size or conversely to achieve improvements in traffic and feature capability through the practical application of extra large integrated circuit technology. Economies achieved would be further enchanced if the practice of segregation could be discarded or made less rigid.

SUMMARY OF THE INVENTION

It is the object of the invention to provide a back plane arrangement which is conveniently configurable or re-configurable in a plurality of variations for interconnection of shelf-retained electronic circuit modules of two distinct family types while minimizing risk of illogical or damaging interconnection configurations.

In accordance with the invention a connector shroud is provided for assembly with a plurality of elongated connector elements being arranged in a predetermined pattern for coupling with a female connector. The connector shroud includes a base being a flat body bounded by side and end portions. A plurality of apertures extend through the base and are arranged in a pattern for accepting the elongated connector elements. Most of the apertures are of a size to freely accept the corresponding elongated connector elements. The remaining apertures are of a smaller size to frictionally accept the corresponding elongated connector elements such that the connector shroud is removably retained in preferred juxtaposition with the elongated connector elements.

Also in accordance with the invention a connector shroud is provided for assembly with a plurality of elongated connector elements being anchored in a circuit board back plane in a pattern for coupling with a first female connector. The connector shroud has a base which base includes a plurality of apertures extending therethrough, the apertures being arranged in a pattern to accept the elongated connector elements. A keyway for mating with a complementary formation in a female connector is defined in a side wall extending from one side of the base. The connector shroud is characterized by a key member extending normal to the base in a direction opposite to that of the side wall. In an assembly with the back plane, the key member extends through an opening in the back plane for cooperating with a complementary structure associated with a second female connector.

Further, in accordance with the invention, the key member includes a latching means for releasably retaining the connector shroud in assembly with the back plane.

In an example embodiment, back plane retained connectors are combined with connector shrouds of either of two specific types for limiting to specific interconnections peculiar to two family types of shelf-retained electronic circuit modules. These interconnections are limited by means of a keyway positioned in a side wall of the connector shroud and a key member which projects from the shroud through an opening in the back plane. The keyway provides for restricted connection to the back plane connector on a back side of the back plane and the key member provides for connection of circuit modules limited to one family type to the back plane connector on a front side of the back plane.

BRIEF DESCRIPTION OF THE DRAWINGS

An example embodiment of the invention is described with reference to the accompanying drawings wherein:

FIG. 13 is a partial plan view illustrating cooperation between the connector shroud illustrated in FIG. 4 and a variant of the key formation shown in FIG. 9 and limiting to interconnections of electronic circuit modules of a second family type;

FIG. 14 is a partial plan view illustrating interconnection denial between the key formation shown in FIG. 13 and the connector shroud illustrated in FIG. 4;

FIG. 15 is a partial plan view illustrating interconnection denial between the key formation shown in FIGS. 13 and 14 and the key member which designates the third family type of electronic circuit module;

FIG. 16 is a perspective view illustrating cooperation between the connector shroud illustrated in FIG. 3 and an example of a female cable connector.

FIG. 17 is a perspective view illustrating cooperation between the connector shroud illustrated in FIG. 3 and another example of a female cable connector.

DETAILED DESCRIPTION

Figures 1A, 1B, 1C:
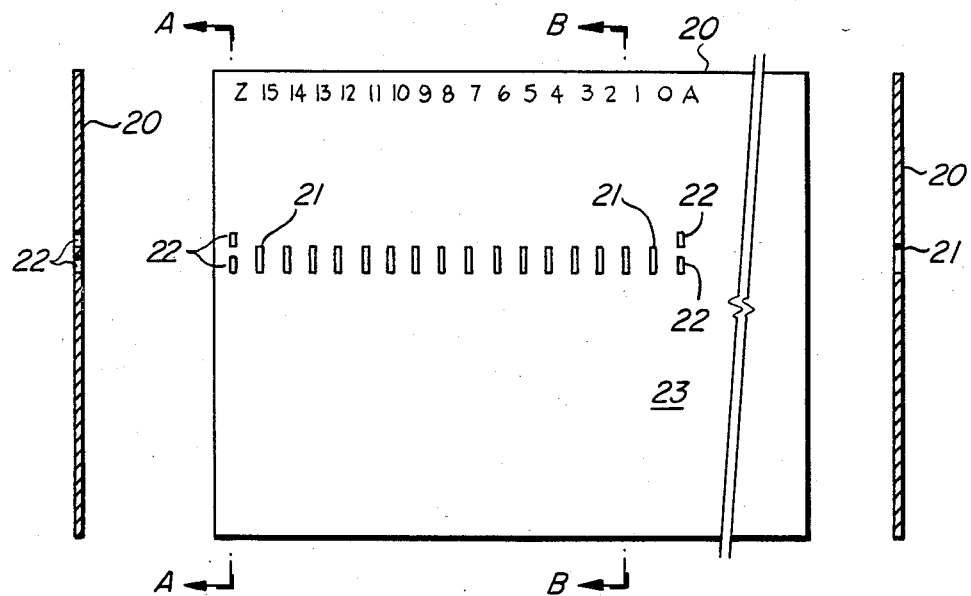
FIG. 1A is a rear elevational view of a back plane for an electronic circuit module equipment shelf which permits variable interconnection configurations and re-configurations.
FIG. 1B is a sectional view of the back plane in FIG. 1A, taken along a line AA.
FIG. 1C is a sectional view of the back plane in FIG. 1B, taken along a line BB.

In FIGS. 1A, 1B and 1C a back plane 20 includes an area designated in columns reading from right to left A, 0-15 and Z. The area of the columns is intended to provide for interconnection of circuit modules in an electronic apparatus, in this example a telecommunications exchange for switching both synchronous and asynchronous traffic and for providing various optional value added services. The numerically labelled columns each include an elongated rectangular slot or cutout 21 in the back plane 20, and the alphabetically labelled columns each include a pair of rectangular slots or cutouts 22 in the back plane 20. An area 23, to the right of the columns is generally reserved for power supply modules and the like and is not further discussed.

Figure 2:
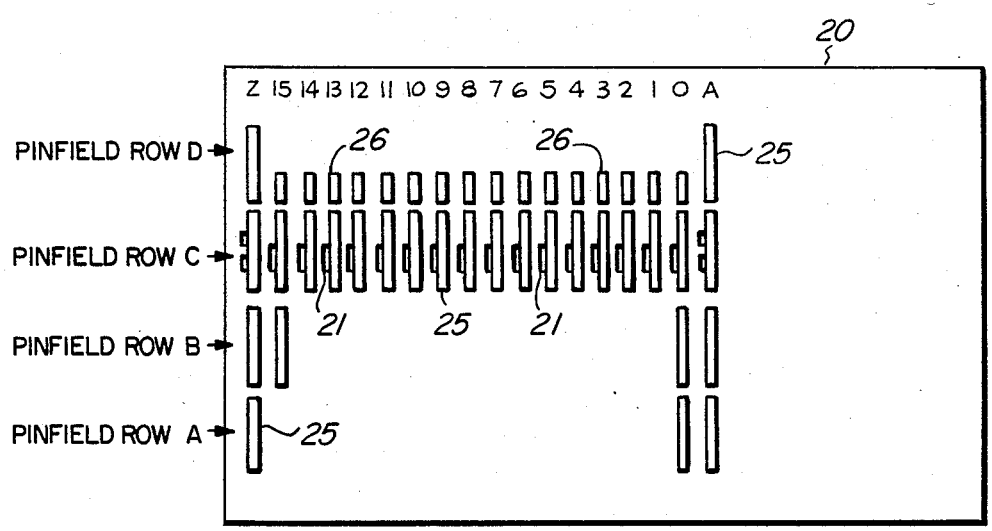
FIG. 2 is a rear elevational view of the back plane assembly using the back plane shown in FIG. 1A.

Referring to FIG. 2, pinfield rows A, B, C, and D are indicated to the left of the back plane 20. The pinfield rows extend across the area of the columns A, 0-15 and Z. Each of the columns 0-15 is interconnected by parallel buses comprising printed circuit paths not shown, which extend across a surface of the back plane in the pinfield rows A and B. In each of the columns 0-15 each printed circuit path is electrically connected to an elongated connector element, not shown, which is anchored in the back plane 20 and extends from the front surface of the back plane for connection with an electronic circuit module. Those areas of the columns, A, 0-15 and Z indicated by long rectangular boxes 25 and shorter rectangular boxes 26 also include elongated connector elements, not shown. However these elements, in contrast to the previously mentioned elongated connector elements protrude from both the front surface and the back surface of the back plane 20, and in addition to being connectable with the circuit modules are thus also available for interconnections by means other than the printed circuit paths carried on the surfaces of the back plane 20.

Figure 3:
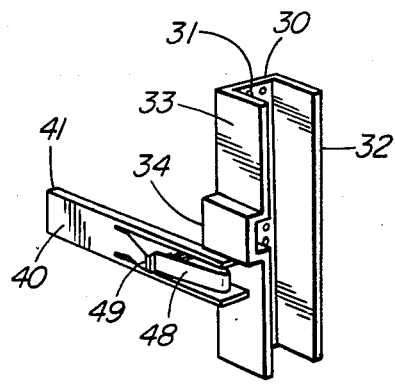
FIG. 3 is a perspective view of a connector shroud in accordance with the invention for use with the back plane shown in FIG. 1A as depicted in FIG. 2.
Figure 4:
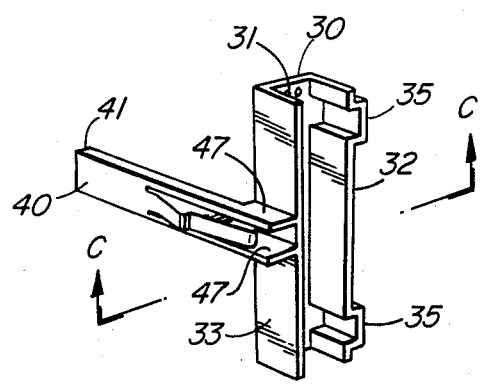
FIG. 4 is a perspective view of another example of a connector shroud in accordance with the invention for use with the back plane in FIG. 1A as depicted in FIG. 2.

Connector shrouds as depicted in FIGS. 3 and 4 may be placed in any of the rectangular areas 25 providing that the area 25 is adjacent one of the rectangular slots 21 as depicted in FIG. 2. Placement of the connector shroud of FIG. 3 in one of the columns 0-15 limits interconnectability of that column to that which is suitable for electronic circuit modules belonging to a first family type. Placement of the connector shroud of FIG. 4 in one of the columns 0-15 limits interconnectability of that column to that which is suitable for electronic circuit modules belonging to a second family type.

Figure 5:
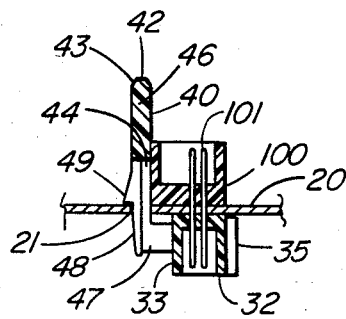
FIG. 5 is a cross-sectional view of the connector shroud illustrated in FIG. 4, taken along a line CC and shown in typical assembly with a portion of the back plane shown in FIG. 1.
Figure 6:
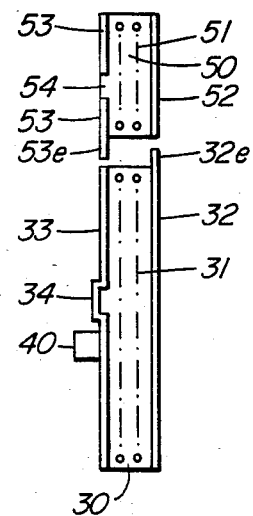
FIG. 6 is a plan view of the connector shroud illustrated in FIG. 3, in tandem combination with an auxiliary connector shroud.
Figure 7:
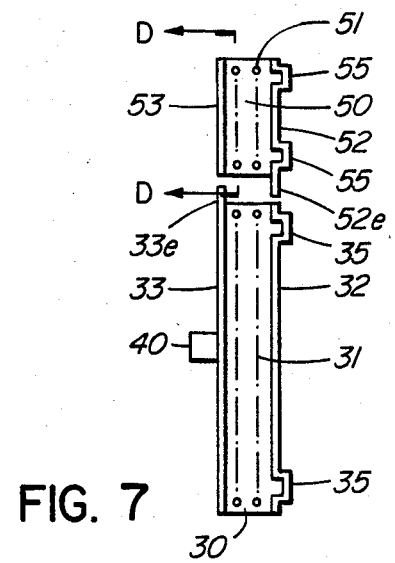
FIG. 7 is a plan view of the connector shroud illustrated in FIG. 4 in tandem combination with another example of an auxiliary connector shroud.

Referring to FIGS. 3, 4, 6 and 7, each of the connector shrouds includes a base portion 30 and two columns of apertures 31 formed therein. Sidewalls 32 and 33 extend from sides of the base portion 30. In FIGS. 3 and 6 a keyway 34 is positioned in the wall 33, about equal distances from the ends of the connector shroud as shown. A key member 40 projects, adjacent the keyway 34, from the wall 33 and toward and beyond the base portion 30. In FIGS. 4 and 7 a pair of keyways 35, each similar to the keyway 34 are located near opposite ends of the side wall 32. In this example, the keyway 40 projects from the side wall 33 as before described however it is located so as to occupy a position similar to that of the keyway 34. The key member 40 as shown in FIGS. 3-5 is bifurcated, to define on a pair of legs 47 which extend from the side wall and which connect with a solid body portion 46 at 44. The solid body portion extends to a tip 41 which includes an end surface 42 which connects with surfaces of the body portion 46 via angular flats 43. A latching mechanism includes a flexible body portion 48 which extends from the solid body portion 46 between the legs 47 and includes a step formation 49 intermediate the length of the body portion 48 and protruding to be engageable with a peripheral edge of the slot 21 as shown in FIG. 5.

Auxiliary connector shrouds intended for use in those areas designated 26 in FIG. 2 are illustrated in FIGS. 6 and 7. The auxiliary connector shrouds each include a base portion 50 having apertures 51 formed therein, somewhat similar to the base portion 30. Side walls 52 and 53 extend from sides of the base portion 50. In FIG. 6 the wall 53 is in two sections with a gap in between providing a keyway 54. Also in FIG. 6 wall extensions 53e in the auxiliary shroud and 32e in the connector shroud restrict these shrouds when fitted over the appropriate connector elements in the back plane 20 to the tandem-like combination shown. The auxiliary shroud in FIG. 7 is similar to the auxiliary shroud in FIG. 6 in that it also includes a base portion 51 and side walls 52 and 53. However in this example the side wall 53 is continuous and the side wall 52 includes a pair of keyways 55, one near either end as shown. Also in FIG. 7 wall extensions 52e in the auxiliary shroud and 33e in the connector shroud restrict these shrouds when fitted over the appropriate connector elements in the back plane 20 to the tandem-like combination shown.

FIG. 5 illustrates an exemplary cross-section of an assembly of the back plane 20 at one of the slots 21 with an adjacent pair of elongated connector elements 101 and a typical module connector shroud 100 being fixed to the front surface of the back plane 20. The assembly includes the connector shroud shown in FIG. 4 viewed across a line CC.

Figure 8:
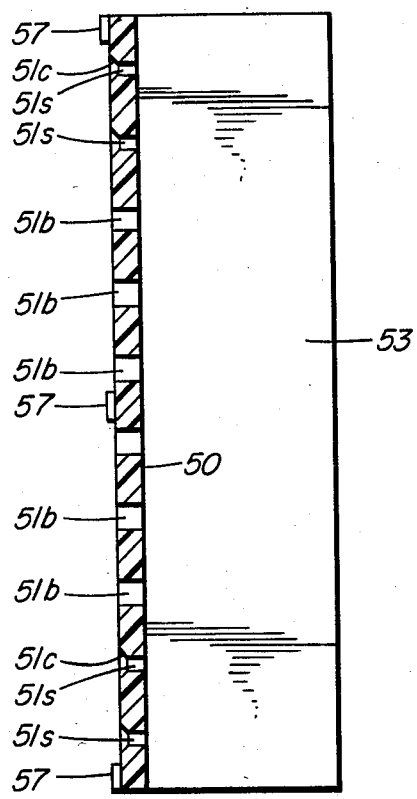
FIG. 8 is an enlarged cross-sectional view of the auxiliary connector shroud taken along a line DD in FIG. 7.

FIG. 8 illustrates a cross-section of the auxiliary shroud in FIG. 7 when viewed along a line DD. This figure particularly illustrates an arrangement of the apertures 51 in the base 50. It has been found that during manual placement or removal of a shroud over the associated pins 101 that frictional resistance is preferred and furthermore is essential for the desired retention of the auxiliary shrouds. Hence it appeared reasonable to provide apertures 51 of a size to each yield a slight interference fit. However it was found that very precise tolerances which were difficult to adhere to were required. Otherwise if the apertures were slightly too large the shroud fitted loosely and if the apertures were slightly too small, it was practically impossible or at least unduly difficult to force the shroud over the pins. The solution to this problem is illustrated in FIG. 8. As shown most of the apertures are of sufficient size to freely accept the elongated connector elements or pins 101. These apertures are identified by the designation 51b. The remaining apertures are of a lesser size and are identified by the designation 51s. The apertures 51s are intended to yield a severe interference fit requiring substantial displacement of the base material when mated with the corresponding pins. As there are only a few of these apertures in the base a broader variation in aperture size is permissible with virtually imperceptible variance in frictional resistance and retention providing that the shroud is formed from a plastic material known as ABS Cycola KVW material or other material of similar resilience. Each of the apertures 51s includes a tapered shoulder 51c whose maximum dimension (i.e., the left most edge in FIG. 8) is at least greater than the diameter of the apertures 51b, to aid in aligning the aperture with the pins 101 during insertion. Feet 57 protrude a short distance from the base 50 and in assembly rest against the back surface of the back plane 20. A similar arrangement of the apertures in the bases of all the shrouds in FIGS. 3, 4, 6 and 7 is preferred, however it is only illustrated in relation to one of the auxiliary shrouds as a matter of convenience.

Figure 9:
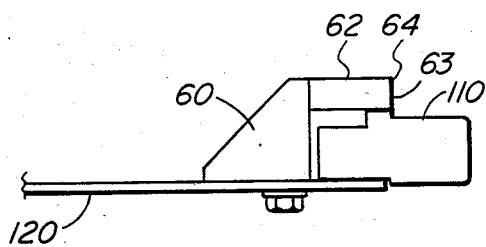
FIG. 9 is a side view of part of a printed circuit board (PCB) exemplary of an electronic circuit module which illustrates an arrangement of a PCB female connector and an associated key formation.

FIG. 9 shows part of a printed circuit board PCB base typical of that in an electronic circuit module and associated with a female connector 110 for mating with the pins 101 in one of the columns 0–15 in FIGS. 1A and 2. A key structure includes a body 60 and a finger 62 projecting from the body 60 which terminates at an end portion 63 above the female connector 110. As shown, part of the surface of the end portion 63 is angled to meet a surface of the finger 62 to describe an acute interior angle at a point 64. This structure provides a depressed area in combination with the upper surface of the female connector 110, which tends to capture the tip 42 of the key member 40 in instances as are most readily observable with reference to FIGS. 10–15.

Figure 10:
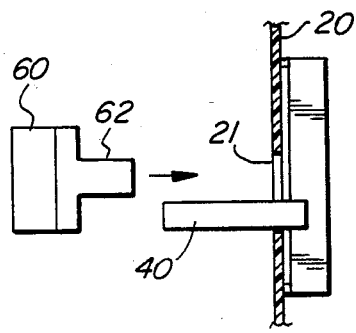
FIG. 10 is a partial plan view illustrating cooperation between the connector shroud illustrated in FIG. 3 and the key formation shown in FIG. 9 and limiting to interconnections of electronic circuit modules of a first family type.
Figure 11:
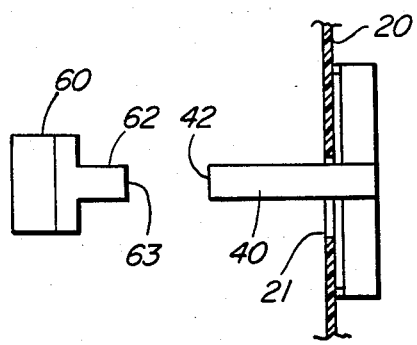
FIG. 11 is a partial plan view illustrating interconnection denial between the key formation shown in FIG. 10 and the connector shroud illustrated in FIG. 4.
Figure 12:
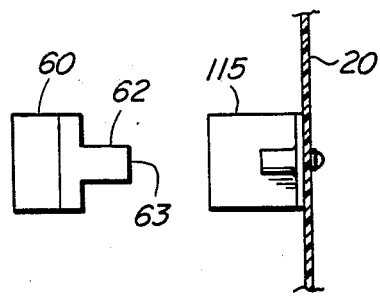
FIG. 12 is a partial plan view illustrating interconnection denial between the key formation shown in FIGS. 9, 10 and 11 and a key member designating a third family type of electronic circuit module.

The simplified diagrams in FIGS. 10, 11 and 12 illustrate discriminating functions of the connector shrouds of FIGS. 3 and 4 and a key block 115 respectively in combination with one form of the key structure 60 being part of a circuit module belonging to the first family type.

FIG. 10 shows acceptance for interconnection and FIGS. 11 and 12 show discriminating rejection wherein the finger 62 collides with the key member 40 or the key block 115. The key block 115 can be installed along pin field row C, the front surface of the back plane 20 typically in line with the row of slots 21 but to the right thereof to prevent improper module insertion in a shelf position reserved for a power converter module. The simplified diagrams in FIGS. 13, 14 and 15 illustrate the discriminating function of the connector shrouds of FIGS. 4 and 3 and the key block respectively in combination with another form or variant of the key structure 60 wherein it is part of a circuit module belonging to the second family type. FIG. 13 shows acceptance for interconnection. FIGS. 14 and 15 show discriminatory rejection wherein the finger 62 collides with the key member 40 and the key block 115 respectively.

FIGS. 16 and 17 each illustrate discriminatory acceptance of a female ribbon cable connector as in the area behind the back plane. In FIG. 16 a connector shroud similar to that in FIG. 4 is shown with keyways 35 in alignment with key 145 carried on the body of a female connector 140, ready for insertion into the connector shroud. In FIG. 17 a connector shroud similar to that in FIG. 3 is shown with the keyway 34 in alignment with a key 134 carried on the body of a female connector 130.

In summary, the foregoing description illustrates an interconnection arrangement for an electronic apparatus wherein back plane-retained shrouds of two types discriminate acceptable connection on both front and back sides of the back plane simultaneously. In one example the influence of the connector shrouds is extended along the back side of the back plane by an auxiliary connector shroud. In one case the connector shroud is retained by frictional engagement with some but not all of the elongated connector pins which extend through its base, and in another case the connector shroud includes a conveniently releasable latching element for retaining the shroud in position. It is envisaged that electronic apparatus in accordance with the invention may be reliably reconfigured even while normal operating power is maintained, that is without shutting the system down, as for example when it is desired to add a new feature or more communication capacity to the system.

What is claimed is:

1. A connector shroud for assembly with a plurality of elongated connector elements being arranged in a row or column-like pattern for coupling with a female connector, the connector shroud comprising:

a base including a flat body portion being defined by side and end portions and having a plurality of apertures extending therethrough and being arranged in said pattern for accepting the elongated connector elements;

a key formation at a predetermined location for mating with a complementary keying formation in the female connector;

wherein most of the apertures are of such a size as to freely accept and release the elongated connector elements, and the remaining apertures are of such a size as to resistively accept and release the elongated connector elements, whereby acceptance and release of the elongated connector elements causes deformation of a side wall of the respective aperture.

2. A connector shroud as defined in claim 1 further characterized in that said remaining apertures are divided between areas of the base adjacent the end portions.

3. A connector shroud for assembly with a plurality of elongated connector elements being anchored in a circuit board back plane and protruding beyond back and front surfaces of the back plane in a pattern for coupling with female connectors, the connector shroud comprising, a base including a flat body including side and end portions and a plurality of apertures extending therethrough, the apertures being arranged in said pattern for accepting the elongated connector elements, a keyway being defined in a side wall extending from one of the side portions normal to the flat body portion, the keyway being for mating with a complementary keying formation in a first female connector to permit discriminatory coupling with the elongated connector elements adjacent one surface of the back plane, the connector shroud being characterized by:

a key member extending normal to the flat body portion in a direction opposite to that of the side wall, in assembly the key member extending through an opening in the circuit board back plane and being for cooperating with a complementary keying structure associated with a second female connector different from said first female connector to permit discriminatory coupling of the elongated connector elements adjacent another surface of the back plane.

4. A connector shroud as defined in claim 3 wherein the key member is provided by an elongated body extending from adjacent one of the side portions normal to the flat body portion in a direction opposite to that of the side wall.

5. A connector shroud as defined in claim 3 including two side walls, one extending from each of the side portions to define a channel with the base, the connector shroud being further characterized in that the key member is rigidly connected to and carried by one of the side walls at one of two predetermined locations along the side wall to discriminate between keying structures of two different types.

6. A connector shroud as defined in claim 3 being further characterized by a latching means being carried by the side wall for releasably engaging with said opening in the circuit board back plane for retaining the connector shroud in assembly therewith.

7. A connector shroud as defined in claim 3 being further characterized in that most of the apertures in the base are large enough to freely accept and release the elongated connector elements and the remaining apertures are only large enough to resistively accept and release the elongaged connector elements, such acceptance being accompanied by deformation of a side wall of the respective aperture.

8. A connector shroud as defined in claim 3 being further characterized by:

a latching means for releasably retaining the connector shroud in assembly with the circuit board back plane.

9. A connector shroud as defined in claim 8 wherein the key member is provided by an elongated body extending from adjacent one of the side portions normal to the flat body portion in a direction opposite to that of the side wall.

10. A connector shroud for assembly with a plurality of elongated connector elements being anchored in a circuit board back plane and protruding beyond back and front surfaces of the back plane in a pattern for coupling with female connectors, the connector shroud comprising, a base including a flat body including side and end portions and a plurality of apertures extending therethrough, the apertures being arranged in said pattern for accepting the elongated connector elements, a keyway being defined in a side wall extending from one of the side portions normal to the flat body portion, the keyway being for mating with a complementary keying formation in a first female connector to permit discriminatory coupling with the elongated connector elements adjacent one surface of the back plane, the connector shroud being characterized by:

a key member being provided by an elongated body extending from adjacent one of the side portions, normal to the flat body portion in a direction opposite to that of the side wall, in assembly the key member extending through an opening in the circuit board back plane and being for cooperating with a complementary keying structure associated with a second female connector different from said first female connector to permit discriminatory coupling of the elongated connector elements adjacent another surface of the back plane;

a portion of the elongated body which extends from the side wall being bifurcated to define two rigid legs which merge with a solid portion of the elongated body intermediate a terminating end of the elongated body and the base, and a latching means including a flexible leg extending from the solid portion between the two legs and including a catch formation protruding outwardly from the flexible leg and beyond a side of the elongated body for latching against a side wall of the opening in the circuit board back plane and thereby retaining the connector shroud in assembly therewith.

11. A connector shroud as defined in claim 10 further characterized in that the flexible leg extends almost to the extremity of the bifurcated portion of the elongated body such that when the connector shroud is latched against the back surface of the back plane the latching means is conveniently accessible for manipulation of the flexible leg from a rear side of the circuit board back plane to permit unlatching and removal of the connector shroud from assembly with the back plane.

12. An electronic apparatus including shelf-mounted electronic circuit modules, each module including a connector for electrically connecting with connector elements in a back plane assembly extending across a back portion of the shelf, the back plane assembly comprising:

a back plane circuit board wherein said connector elements comprise of pins being anchored in prearranged columns in the circuit board, a plurality of the prearranged columns each including a group of pins each pin of which protrudes from both front and back faces of the circuit board, the circuit board also defining an opening extending therethrough adjacent each said group of pins; and a connector shroud being assembled with each said group of pins on the back surface of the back plane circuit board and comprising:

a side wall positioned along each side of the column, a keyway being defined in one of the side walls for discriminately accepting a complementary key formation in a female connector for coupling with the pins, an elongated key member extending through said adjacent opening for discriminately being accepted by a complementary key formation in a one of the electronic circuit modules such acceptance permitting coupling of the electronic circuit module with said pins, whereby possible interconnections with the electronic circuit modules tend to be limited to those which are operable and are restricted to those which are electrically non-destructive.

13. The back plane assembly as defined in claim 12 wherein the elongated key member in the connector shroud comprises:

an elongated body extending from near one of the side walls through the opening in a direction normal to the back plane, a portion of the elongated body adjacent the side wall being bifurcated to define two rigid spaced apart legs which extend from the side wall and which merge with a solid portion of the elongated body intermediate a terminating end of the elongated body and the side wall; and a latching means for releasably fastening the connector shroud in assembly with the back plane, the latching means including a flexible leg extending from the solid portion between the two legs and including a catch formation protruding outwardly from the flexible leg and beyond a side of the elongated body for resiliently latching against a side wall of the opening in the back plane.

* * * * *